(12) United States Patent
Yokoyama

(10) Patent No.: US 7,759,697 B2
(45) Date of Patent: Jul. 20, 2010

(54) SEMICONDUCTOR DEVICE

(75) Inventor: Takaaki Yokoyama, Kawagoe (JP)

(73) Assignee: Sanken Electric Co., Ltd., Saitama (JP)

( * ) Notice: Subject to any disclaimer, the term of this patent is extended or adjusted under 35 U.S.C. 154(b) by 826 days.

(21) Appl. No.: 10/592,445

(22) PCT Filed: Mar. 28, 2005

(86) PCT No.: PCT/JP2005/005691

§ 371 (c)(1),
(2), (4) Date: Sep. 8, 2006

(87) PCT Pub. No.: WO2005/124862

PCT Pub. Date: Dec. 29, 2005

(65) Prior Publication Data

US 2007/0206358 A1 Sep. 6, 2007

(30) Foreign Application Priority Data

Jun. 18, 2004 (JP) .............................. 2004-180652

(51) Int. Cl.
*H01L 23/34* (2006.01)
(52) U.S. Cl. .................. 257/177; 257/706; 257/724; 257/712; 257/783; 257/707; 257/E23.051; 257/E23.106; 361/712

(58) Field of Classification Search ................ 257/706, 257/724, 712, 177, 707, 783, E23.051, E23.106; 361/712
See application file for complete search history.

(56) References Cited

U.S. PATENT DOCUMENTS

| 5,739,581 | A | 4/1998 | Chillara et al. | |
| 6,529,224 | B2* | 3/2003 | Shirakawa et al. | 347/200 |
| 7,382,000 | B2* | 6/2008 | Terao | 257/177 |
| 2003/0102489 | A1* | 6/2003 | Nam et al. | 257/177 |

FOREIGN PATENT DOCUMENTS

| JP | 4-93159 | 8/1992 |
| JP | 2001-110986 | 4/2001 |
| JP | 2004-6564 | 1/2004 |

* cited by examiner

*Primary Examiner*—Lynne A Gurley
*Assistant Examiner*—Junghwa M Im
(74) *Attorney, Agent, or Firm*—Bachman & LaPointe, P.C.

(57) ABSTRACT

A semiconductor device is provided which comprises a thermally radiative and electrically conductive support plate 1; and a regulatory semiconducting element 2 mounted on one main surface of support plate 1 through an insulator 3. Insulator 3 comprises an insulative layer 3a mounted on support plate 1 and an adiabatic layer 3b interposed between insulative layer 3a and regulatory semiconducting element 2 to fully protect regulatory semiconducting element 2 from heated environment therearound in the semiconductor device.

6 Claims, 2 Drawing Sheets

SEMICONDUCTOR DEVICE

TECHNICAL FIELD

This invention relates to a semiconductor device, in particular, of the type capable of positively, thermally and electrically isolating a power semiconducting element and a regulatory IC incorporated in the semiconductor device.

BACKGROUND OF THE INVENTION

A semiconductor device is known which has an integral package of a power semiconducting element and a regulatory IC for controlling the power semiconducting element. Not shown, but semiconductor devices of this type are divided into two different structures, namely one is a layered structure which comprises a power semiconducting element and a regulatory IC stacked in turn on a support plate, and the other is an apposed structure of a power semiconducting element and a regulatory IC juxtaposed away from each other on support plate. For example, FIG. 4 of Japanese Patent No. 2,566,207 discloses a semiconductor device of such a layered structure.

Power semiconducting element produces a larger amount of operation heat than that of regulatory IC which is therefore heated by heat generated and transferred from power semiconducting element to regulatory IC. Thus, in some cases, it would be advisable to thermally isolate regulatory IC from power semiconducting element, and also to preferably electrically insulate regulatory IC from the power semiconducting element or support plate for carrying power semiconducting element.

An object of the present invention is to provide a semiconductor device which has a power semiconducting element and a regulatory IC mounted in thermally and electrically separated relation to each other.

SUMMARY OF THE INVENTION

The semiconductor device according to the present invention comprises a thermally radiative and electrically conductive support plate (1); a regulatory semiconducting element (2) and a passive semiconducting element (4) both mounted on one main surface of support plate (1). At least one of regulatory and passive semiconducting elements (2 and 4) is attached on one surface of support plate (1) via an insulator (3) which comprises an insulative layer (3a) mounted on support plate (1) and an adiabatic layer (3b) interposed between insulative layer (3a) and regulatory semiconducting element (2) or between insulative layer (3a) and passive semiconducting element (4). Insulator (3) serves to thermally isolate and electrically insulate regulatory and passive semiconducting elements (2 and 4) from each other.

EFFECT OF THE INVENTION

The present invention can provide a reliable semiconductor device which can prevent deterioration in electric property of a regulatory semiconducting element by heat from a passive semiconducting element while accomplishing a good electric insulation between regulatory and passive semiconducting elements.

BRIEF DESCRIPTION OF THE DRAWINGS

The above-mentioned and other objects and advantages of the present invention will be apparent from the following description in connection with preferred embodiments shown in the accompanying drawings wherein.

EXPLANATION OF SYMBOLS IN DRAWINGS (1) . . . a support plate, (2) . . . a regulatory semiconducting element (a regulatory IC), (3) . . . an insulator, (3a) . . . a dielectric layer, (3b) . . . an adiabatic layer, (4) . . . a passive semiconducting element (a MOS-FET), (6) . . . lead wires.

BEST MODE FOR CARRYING OUT THE INVENTION

Embodiments will be described hereinafter in connection with FIGS. 1 to 5 of the drawings regarding the semiconductor device according to the present invention applied to a power semiconductor device for use in a switching regulator.

Figure 1:
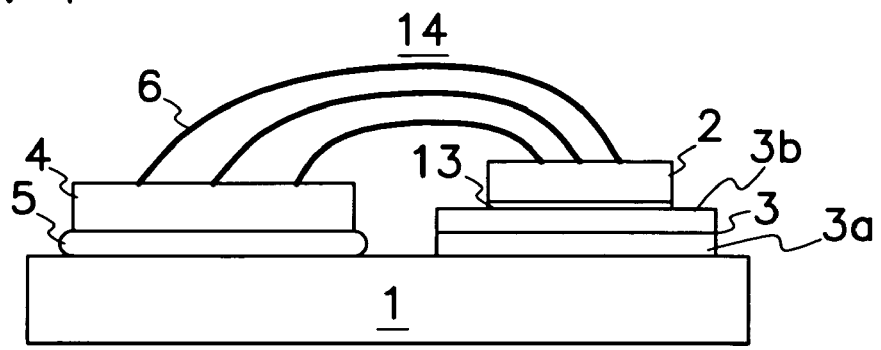
FIG. 1 is a side elevation view showing an embodiment of the semiconductor device according to the present invention before packaging by plastic encapsulation.

As shown in FIG. 1, the semiconductor device according to the present invention comprises a thermally radiative and electrically conductive support plate 1; a regulatory IC 2 as a regulatory semiconducting element mounted on one main surface of support plate 1 through an insulator 3; a MOS-FET 4 as one example of a power or passive semiconducting element mounted on one main surface of support plate 1 through an electrically conductive adhesive or solder 5 in spaced relation to insulator 3; and a plurality of lead wires 6 electrically connecting regulatory IC 2 and MOS-FET 4. Support plate 1 is formed of nickel-plated, thermally radiative and electrically conductive metal such as copper or aluminum, and one main or drain electrode of MOS-FET 4 is electrically connected to support plate 1.

Insulator 3 has two layers which comprise a dielectric layer 3a as an insulative layer mounted on support plate 1, and an thermally insulative or adiabatic layer 3b of high heat transfer resistance mounted on dielectric layer 3 and in contact to regulatory IC 2 for supporting regulatory IC 2. Dielectric layer 3a comprises a dielectric film such as KAPTON® film formed of for example polyimide resin of relatively less gas-bubble content, less- or non-porous or pinhole-free insulating resin, and has its own inherent adhesive property which bonds insulator 3 on support plate 1. Dielectric layer 3a with less or no porosity indicates good electrically insulating property. Otherwise, an adhesive tape may be attached to a bottom surface of dielectric layer 3a to adhere it on support plate 1 through adhesive tape. In any structure, regulatory IC 2 is bonded on adiabatic layer 3b through an adhesive agent 13 interposed between adiabatic layer 3b and regulatory IC 2. Such adhesive agent 13 may be omitted if adiabatic layer 3b has its own adhesive property.

Adiabatic layer 3b is formed of a dielectric film containing relatively more gas bubbles or foamed or expandable plastics such as polyimide foam. Alternatively, adiabatic layer 3b may be formed with a foamed tape material secured to dielectric layer 3a or formed of polyimide resin same as that of dielectric layer 3a or other materials. If both of dielectric and adiabatic layers 3a and 3b comprise double faced adhesive tapes, regulatory IC 2 can easily, readily and strongly be stuck on support plate 1 through dielectric and adiabatic layers 3a and 3b. Otherwise, dielectric and adiabatic layers 3a and 3b may be bonded into a chip-like insulator 3.

Resistance against heat transfer through foamed adiabatic layer 3b is greater than that of substantially foamless dielectric layer 3a so that dielectric layer 3a effectively prevents heat produced from MOS-FET 4 from traveling to regulatory IC 2. Although heat transfer resistance of dielectric layer 3a increases if dielectric layer 3a is formed of foamed plastics similarly to adiabatic layer 3b, inconsistently and concurrently, whole electrical insulation of insulator 3 is deteriorated to fail to establish a reliable electrical insulation between support plate 1 and regulatory IC 2. Therefore, it is important that heat transfer resistance of adiabatic layer 3b is greater than that of dielectric layer 3a.

Figure 2:
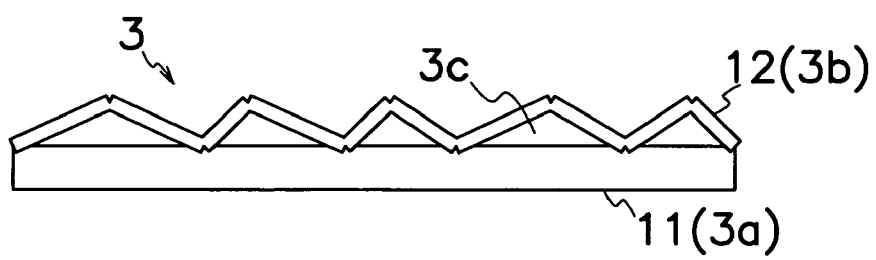
FIG. 2 is a sectional view showing an embodiment of preparing an insulator.
Figure 3:
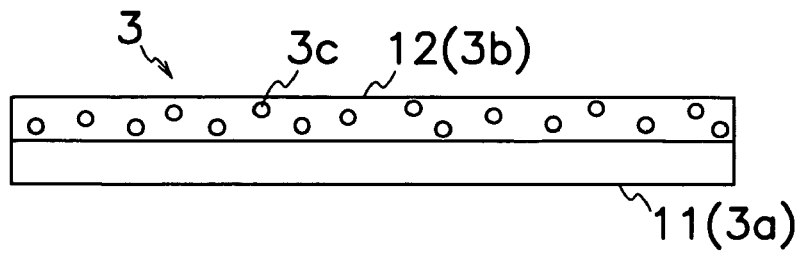
FIG. 3 is a sectional view showing another embodiment of preparing an insulator.

FIG. 2 shows a first preparation of insulator 3 by fusing a corrugated resinous film 12 on an adhesive plastic tape 11 under pressure to form voids 3c at given intervals between plastic tape 11 as a dielectric layer 3a and resinous film 12 as an adiabatic layer 3b. FIG. 3 illustrates a second preparation of insulator 3 by heating and joining a resinous covering film 12 on a resinous and foamless base plate 11 under pressure wherein covering film 12 contains a foaming agent to provide adiabatic layer 3b, and base plate 11 provides dielectric layer 3a without foaming agent so that foaming agent in covering film 12 expands during heating to form gas bubbles 3c.

Electrodes not shown on regulatory IC 2 and a source electrode not shown of MOS-FET 4 are electrically connected to a plurality of lead terminals 7 disposed adjacent to support plate 1. A lead terminal 7a formed integrally with support plate 1 provides an electrified path so that electric current, namely main or drain current of MOS-FET 4 flows through support plate 1 and lead terminals 7b. One and the other ends of lead wires 6 are connected respectively to terminals not shown of regulatory IC 2 and gate terminals not shown of MOS-FET 4 by a known wire bonding technique so that lead wires 6 bridge between regulatory IC 2 and MOS-FET 4 through an upper space 14 to repetitively turn MOS-FET 4 on and off by drive pulses from regulatory IC 2 through lead wires 6 under control of regulatory IC 2 during the operation.

During the on-period of MOS-FET 1, drain current passes through support plate 1 and MOS-FET 4 between lead terminals not shown while MOS-FET 1 emits heat which can effectively and sufficiently be released from support plate 1 through solder 5 to outside for the ample radiation performance, and therefore, heavy electric current can pass through MOS-FET 1. In this case, it should be noted that no heat is transferred to regulatory IC 2 although MOS-FET 4 produces increased amount of heat since insulator 3 perfectly shuts off heat from MOS-FET 4. In addition, the device can prevent short circuit accident by undesirable electrical communication between MOS-FET 4 and regulatory IC 2 since dielectric layer 3a accomplishes a complete electric insulation between MOS-FET 4 and regulatory IC 2. As above-mentioned, insulator 3 has three functions for firstly firmly joining regulatory IC 2 on support plate 1, secondly thermally isolating MOS-FET 4 and regulatory IC 2 from each other, and thirdly electrically insulating MOS-FET 4 and regulatory IC 2 from each other. Insulator 3 serves to alleviate external force applied to regulatory IC 2 by means of flexible or cushioning action of insulator 3 to prevent mechanical damage to regulatory IC 2 as well as block heat from MOS-FET 4 to provide sufficient protection against heat for regulatory IC 2.

Figure 4:
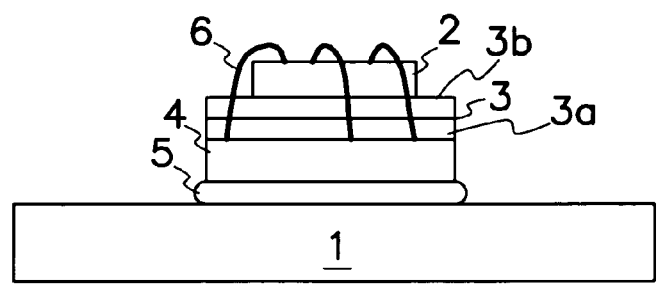
FIG. 4 is a side elevation view showing another embodiment of the present invention.
Figure 5:
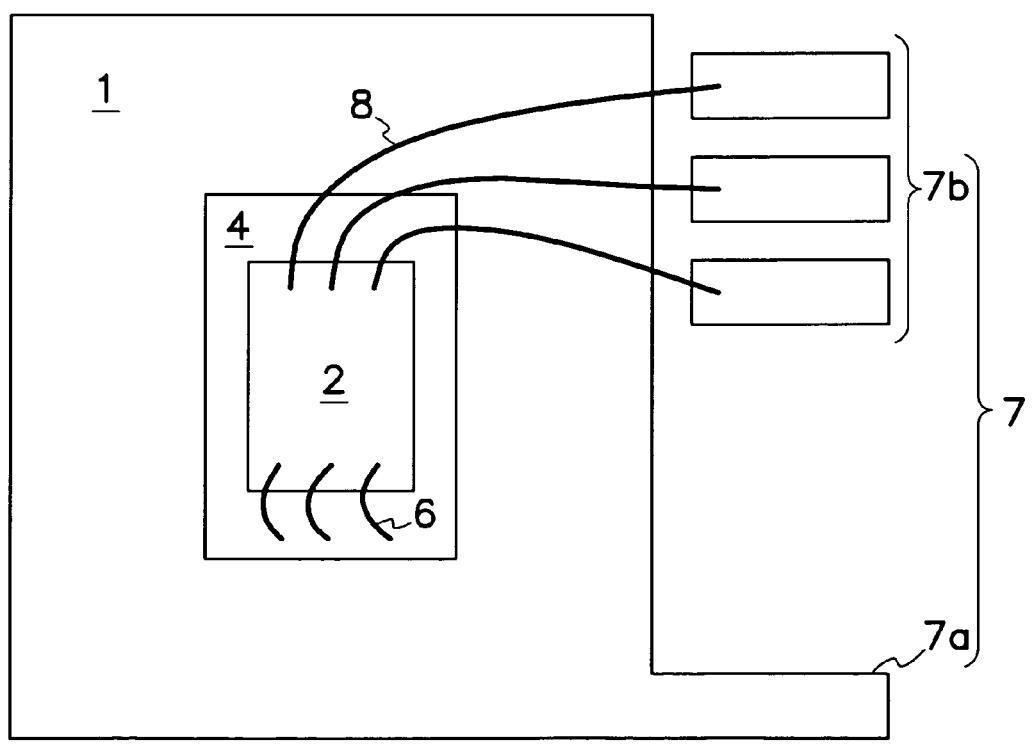
FIG. 5 is a plan view of FIG. 4.

FIG. 1 shows the embodiment of the present invention in the apposed structure of MOS-FET 4 and regulatory IC 2 juxtaposed adjacent to but away from each other on support plate 1. Unlike the apposed structure, a stacked structure may be applied to the semiconductor device as shown in FIGS. 4 and 5 wherein regulatory IC 2 is mounted on insulator 3 which is attached to MOS-FET 4 on support plate 1 for highly densified mounting and reduced plane occupation area of the semiconductor device. In this structure, MOS-FET 4 is mounted on one main surface of support plate 1 through an electrically conductive adhesive or solder 5, and then regulatory IC 2 is mounted on one main surface of MOS-FET 4 through insulator 3. Lead wires 6 electrically connect electrodes on regulatory IC 2 and MOS-FET 4, and electric current flows through support plate 1 and one 7a of lead terminals 7 integrally formed with or connected to support plate 1. Other electrodes of regulatory IC 2 are connected to a plurality of lead terminals 7b disposed adjacent to support plate 1 through lead wires 8.

Insulator 3 has a two-layered structure which comprises an electrically insulative and dielectric layer 3a attached to one main surface of MOS-FET 4, and a thermally adiabatic layer 3b of high heat transfer resistance, secured on dielectric layer 3a for supporting regulatory IC 2 on adiabatic layer 3b. Dielectric layer 3a comprises a dielectric film such as KAPTON® film formed of for example polyimide resin of relatively less-porous, non-porous or pinhole-free insulating resin, and has its own inherent adhesive property which bonds insulator 3 on support plate 1. Dielectric layer 3a with less or no porosity indicates good electrically insulating property. Formed of relatively more foamed dielectric film or foamed resin such as polyimide foam is adiabatic layer 3b which positively blocks heat from MOS-FET 4 not to transmit heat to regulatory IC 2.

INDUSTRIAL APPLICABILITY

The present invention is particularly applicable to a semiconductor device which comprises a power semiconducting element for allowing relatively large current to pass, and a regulatory semiconducting element for controlling the power semiconducting element.

What is claimed is:
1. A semiconductor device comprising:
   a thermally radiative and electrically conductive support plate,
   a regulatory semiconducting element and a passive semiconducting element both supported on one main surface of support plate, and
   an insulator adhered between said support plate and regulatory semiconducting element or between said regulatory semiconducting element and passive semiconducting element,
   said insulator having an insulative layer and an adiabatic layer bonded on said insulative layer under pressure,
   said insulative layer being adhered on said support plate or passive semiconducting element,
   said adiabatic layer being formed of a dielectric film containing gas bubbles or of foamed or expandable plastics interposed between said insulative layer and regulatory semiconducting element, and
   said insulative layer having its gas-bubble content less than that of said adiabatic layer,
   wherein said insulator is formed by fusing under pressure said adiabatic layer in the form of a corrugated resinous film on said insulative layer in the form of an adhesive plastic tape.
2. The semiconductor device of claim 1, wherein said adiabatic layer is formed of polyimide foam; and said insulative layer is formed of substantially foamless polyimide resin.

3. The semiconductor device of claim 1, wherein said insulative layer has its own inherent adhesive property which bonds said insulator on said support plate or passive semiconducting element.

4. The semiconductor device of claim 1, wherein said insulator produces a flexible or cushioning action for alleviating an external force applied to said regulatory semiconducting element.

5. The semiconductor device of claim 1, further comprising lead wires for electrically connecting said regulatory semiconducting element and passive semiconducting element; and wherein said lead wires are bridged through an upper space over and between said regulatory and passive semiconducting elements to repetitively turn said passive semiconducting element on and off by drive pulses from said regulatory semiconducting element through said lead wires under control of regulatory semiconducting element during the operation.

6. The semiconductor device of claim 1, wherein said regulatory semiconducting element is a regulatory IC, and said passive semiconducting element is a power semiconducting element.

* * * * *